United States Patent
Noguchi et al.

(10) Patent No.: US 9,792,972 B2
(45) Date of Patent: Oct. 17, 2017

(54) MEMORY SYSTEM AND CACHE MEMORY

(71) Applicant: KABUSHIKI KAISHA TOSHIBA, Tokyo (JP)

(72) Inventors: Hiroki Noguchi, Kanagawa (JP); Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/267,206

(22) Filed: Sep. 16, 2016

(65) Prior Publication Data
US 2017/0053689 A1 Feb. 23, 2017

Related U.S. Application Data

(63) Continuation of application No. PCT/JP2015/076488, filed on Sep. 17, 2015.

(30) Foreign Application Priority Data

Sep. 19, 2014 (JP) .................. 2014-191874

(51) Int. Cl.
*G11C 11/16* (2006.01)
*G06F 12/00* (2006.01)
(Continued)

(52) U.S. Cl.
CPC ............ *G11C 11/1697* (2013.01); *G06F 1/32* (2013.01); *G06F 1/3275* (2013.01);
(Continued)

(58) Field of Classification Search
CPC ....... G11C 11/1697; G11C 5/148; G06F 1/32; G06F 1/3296; G06F 12/00; G06F 12/06;
(Continued)

(56) References Cited

U.S. PATENT DOCUMENTS 6,335,895 B1* 1/2002 Sugibayashi .......... G11C 5/147
365/226
6,445,616 B2* 9/2002 Kim .................... G11C 11/5621
365/185.2
(Continued)

FOREIGN PATENT DOCUMENTS

EP 0881575 A1 2/1998
JP 2000-215100 8/2000
(Continued)

OTHER PUBLICATIONS

Jonathan Chang et al., "The 65-nm 16-MB Shared On-Die L3 Cache for the Dual-Core Intel Xeon Processor 7100 Series", *IEEE Journal of Solid-State Circuits*, vol. 42, No. 4, Apr. 2007, pp. 846-852.
(Continued)

*Primary Examiner* — Ly D Pham
(74) *Attorney, Agent, or Firm* — Finnegan, Henderson, Farabow, Garrett & Dunner, L.L.P.

(57) ABSTRACT

A memory system has a non-volatile memory including a plurality of circuit blocks using different voltages, a power-off switch circuitry that switches whether or not voltage supply to each of the plurality of circuit blocks in the non-volatile memory is cut off, and a power-off controller that controls the switching of the power-off switch circuitry based on at least one of circuit volumes of the plurality of circuit blocks, standby power of the plurality of circuit blocks, and a circuit volume of the power-off switch circuitry.

16 Claims, 11 Drawing Sheets

(51) Int. Cl.
- *G06F 12/06* (2006.01)
- *G06F 12/08* (2016.01)
- *G06F 1/32* (2006.01)
- *G06F 12/0893* (2016.01)
- *G11C 5/14* (2006.01)

(52) U.S. Cl.
CPC ............ *G06F 1/3296* (2013.01); *G06F 12/00* (2013.01); *G06F 12/06* (2013.01); *G06F 12/08* (2013.01); *G06F 12/0893* (2013.01); *G11C 5/148* (2013.01); *G06F 2212/1028* (2013.01); *G06F 2212/222* (2013.01); *Y02B 60/1225* (2013.01)

(58) Field of Classification Search
CPC ................ G06F 12/08; G06F 12/0893; G06F 2212/1028; G06F 2212/222; Y02B 60/1225
USPC .................. 365/158; 711/E12.042, E12.045, 711/E12.048, 118
See application file for complete search history.

(56) References Cited

U.S. PATENT DOCUMENTS

| | | | | |
|---|---|---|---|---|
| 6,762,969 | B2* | 7/2004 | Sasaki | G11C 29/02 257/E27.103 |
| 7,439,797 | B2* | 10/2008 | Byeon | G11C 5/145 327/540 |
| 2009/0109787 | A1* | 4/2009 | Rao | G11C 16/10 365/230.03 |
| 2011/0219259 | A1* | 9/2011 | Frost | G06F 11/07 714/6.2 |
| 2012/0166715 | A1* | 6/2012 | Frost | G06F 11/1068 711/103 |
| 2013/0031397 | A1 | 1/2013 | Abe et al. | |
| 2013/0246818 | A1 | 9/2013 | Nomura et al. | |
| 2013/0268795 | A1 | 10/2013 | Nomura et al. | |
| 2014/0258755 | A1* | 9/2014 | Stenfort | G06F 1/30 713/323 |

FOREIGN PATENT DOCUMENTS

| | | |
|---|---|---|
| JP | 2009-282880 | 12/2009 |
| JP | 2013-30024 | 2/2013 |
| JP | 5337239 | 8/2013 |
| JP | 2013-190970 | 9/2013 |
| JP | 2013-192239 | 9/2013 |
| JP | 2013-218403 | 10/2013 |
| JP | 2014-160362 | 9/2014 |
| WO | WO 97/30395 | 8/1997 |
| WO | WO 2010/125852 | 11/2010 |

OTHER PUBLICATIONS

International Search Report mailed Nov. 24, 2015 from the Japanese Patent Office in International Application No. PCT/JP2015/076488. 2 pages.

English Translation of the International Preliminary Report and Written Opinion issued by the International Bureau of WIPO dated Mar. 30, 2017, in counterpart International Application No. PCT/JP2015/076488.

* cited by examiner

| STATE | PS | 0 | 1 | 2 | 3 | 4 | 5 | 6 | 7 |
|---|---|---|---|---|---|---|---|---|---|
| 3 | Off | | | | | | | | |
| 2 | Vss | 1 | | | | | | | |
| 1 | Vddc | 1 | | | | | 1 | | |
| R | Read | 1 | 1 | | | | 1 | 1 | |
| W | Write | 1 | 1 | | | | 1 | | 1 |
| COMPARATIVE EXAMPLE | Ref | 1 | 1 | 1 | 1 | 1 | 1 | 1 | 1 |

FIG.4

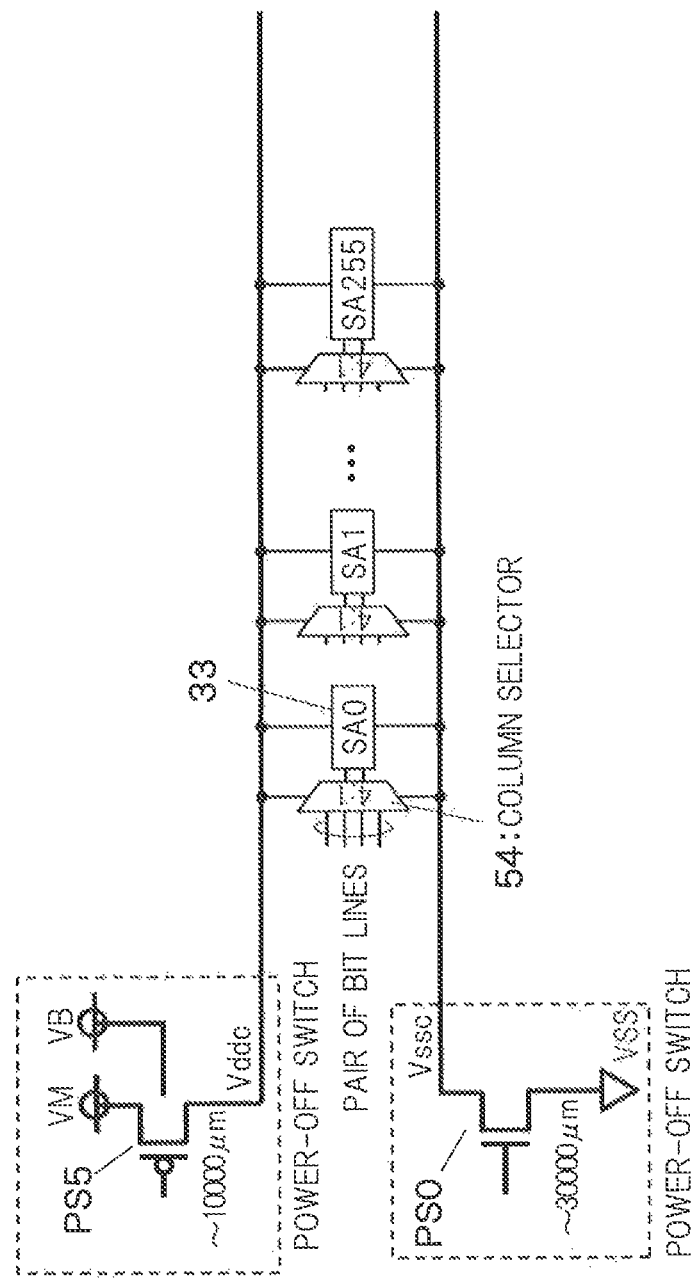
F I G. 10

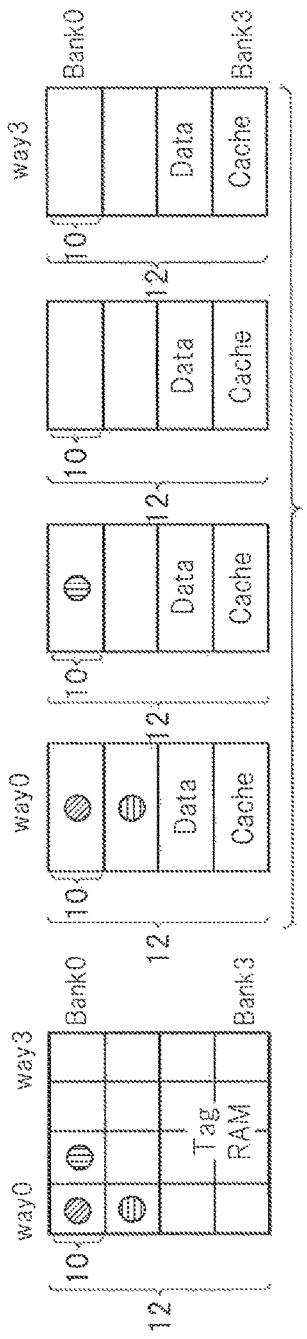
F I G. 11A
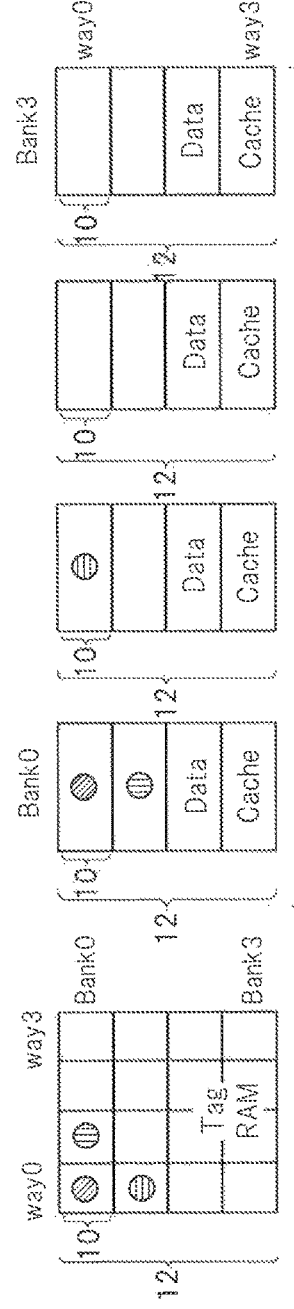
F I G. 11B
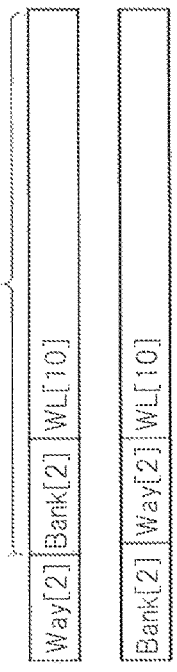
F I G. 11C
F I G. 11D

MEMORY SYSTEM AND CACHE MEMORY

CROSS REFERENCE TO RELATED APPLICATIONS

This application is based upon and claims the benefit of priority from the prior Japanese Patent Application No. 2014-191874, filed on Sep. 19, 2014, the entire contents of which are incorporated herein by reference.

FIELD

Embodiments described herein relate generally to a memory system and a cache memory.

BACKGROUND

A technique of reducing power consumption by cutting off a power voltage of some circuit blocks has been proposed. For example, when power of a static RAM (SRAM) is cut off stepwise using this technique, since data held in the SRAM disappears if the SRAM is powered off, it is necessary to move data in the SRAM to a non-volatile memory in advance, and thus power-off control is complicated. Further, a non-volatile memory for power-off is necessary in addition to the SRAM, and thus a circuit volume increases.

The SRAM can perform a high-speed operation, but an area per unit cell is large, and power consumption is also large. Furthermore, since the SRAM is a volatile memory, electric power is consumed even during standby.

In recent years, development of a high-speed non-volatile memory is in progress, and Spin Transfer Torque Magnetoresistive RAM (STT-MRAM) or the like attracts attention. Some non-volatile memories such as the STT-MRAM are smaller in power consumption than the SRAM, but there are cases in which a plurality of power voltages are necessary for operation. Since a plurality of power voltages are not constantly used in a non-volatile memory, it is desirable to perform a certain power consumption reduction process.

BRIEF DESCRIPTION OF THE DRAWINGS

FIG. 4 is a diagram illustrating an example of initial parameters stored in an initial value register;

FIG. 10 is a circuit diagram around a sense amplifier; and

FIGS. 11A to 11D are diagrams illustrating a relation between a memory bank and a way.

DETAILED DESCRIPTION

According to one embodiment, a memory system has a non-volatile memory including a plurality of circuit blocks using different voltages, a power-off switch circuitry that switches whether or not voltage supply to each of the plurality of circuit blocks in the non-volatile memory is cut off, and a power-off controller that controls the switching of the power-off switch circuitry based on at least one of circuit volumes of the plurality of circuit blocks, standby power of the plurality of circuit blocks, and a circuit volume of the power-off switch circuitry.

Hereinafter, an exemplary embodiment of the present invention will be described with reference to the appended drawings. In the following embodiment, a characteristic configuration and operation in a memory system and a cache memory will be mainly described, but a memory system and a cache memory may have a configuration or an operation omitted in the following description. However, the omitted configuration or operation is also included in the scope of the present embodiment.

Figure 1:
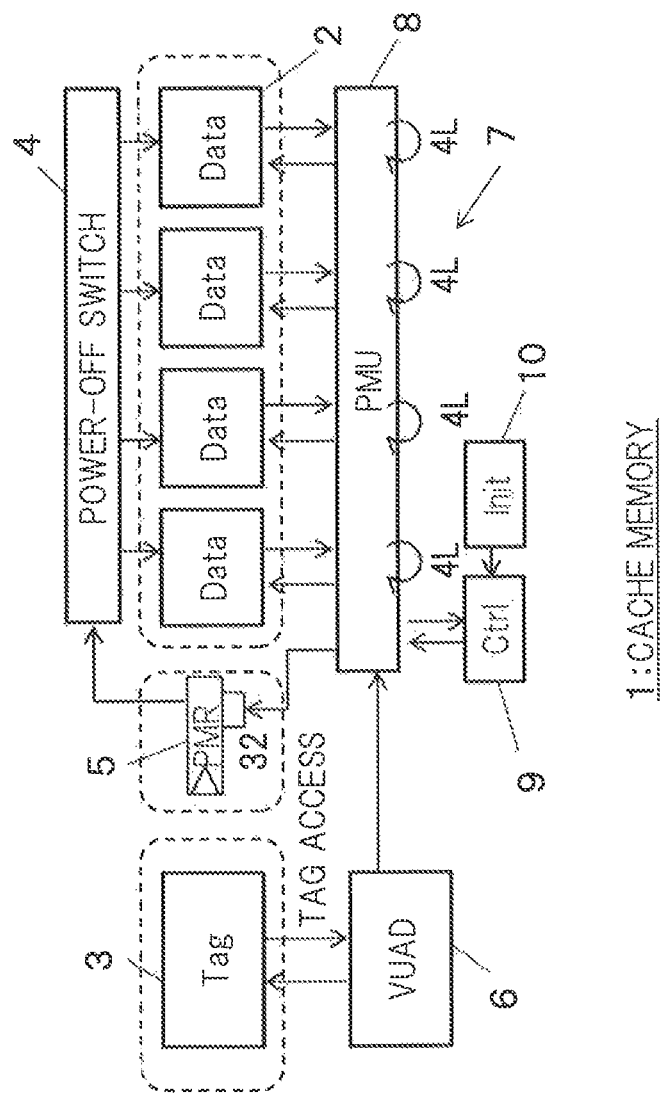
FIG. 1 is a block diagram illustrating a schematic configuration of a memory system according to an embodiment.

FIG. 1 is a block diagram illustrating a schematic configuration of a memory system according to an embodiment. In the memory system of FIG. 1, more specifically, a configuration of a main part of a cache memory is illustrated. A cache memory 1 of FIG. 1 includes a data cache unit 2, a tag unit 3, a power-off switching unit 4, a power-off switching information holding unit (power management register (PMR)) 5, a valid, used, allocate, dirty (VUAD) controller 6, and a power-off control unit 7.

The cache memory 1 of FIG. 1 is, for example, a secondary cache (an L2 cache). The cache memory 1 of FIG. 1 may be applied to a high-order cache memory in addition to the L2 cache.

The data cache unit 2 stores data in units of cache lines. The data cache unit 2 is divided into a plurality of memory banks, and each of the memory banks uses a plurality of power voltages. FIG. 1 illustrates an example in which the data cache unit 2 is divided into four memory banks, but the number of memory banks is not particularly limited. As will be described later, in the present embodiment, power-off control of a plurality of power voltages used in each memory bank is performed independently for each memory bank.

The data cache unit 2 is configured with a non-volatile memory. In the present embodiment, an example in which the data cache unit 2 is configured with an STT-SRAM will be described, but various non-volatile memories may be used instead of the STT-SRAM. The STT-MRAM is a spin injection memory in which magnetization inversion is caused using magnetic momentum by spin (rotation) of electrons and characterized in that write power or write delay are much smaller than those of non-volatile memories that have been researched and developed until now. The STT-MRAM has a high-speed operation (an access speed is 10 ns or less) and high rewriting resistance ($10^{15}$ or more) which are comparable to the SRAM and has a high compatibility with a low-power CMOS logic process, and thus the STT-MRAM is suitable for use as a cache.

The tag unit 3 stores address information of data stored in the data cache unit 2. The tag unit 3 may be configured with a non-volatile memory or may be configured with a volatile memory such as an SRAM but is preferably configured with a high-speed memory.

The power-off switching unit 4 performs power-off control of a plurality of power voltages used by each memory bank for each memory bank of the data cache unit 2. As will be described later, the power-off switching unit 4 includes a plurality of power-off switches which perform switching between supply and power-off of a plurality of power voltages for each memory bank. The power-off switches are turned on or off stepwise according to an operation state of a corresponding memory bank as will be described later.

The power-off switching information holding unit 5 holds power-off switching information of the power-off switching unit 4 set by the power-off control unit 7 which will be described later.

As will be described later, the VUAD controller 6 is installed in a tag controller, and performs hit/miss determination as to whether or not an address in accordance with an access request from a processor core is identical to an address stored in the tag unit 3 and write control of an address to be stored in the tag unit 3.

The power-off control unit 7 includes a power management unit (PMU) 8, a control unit (Ctrl) 9, and an initial value register (Init) 10. As will be described later, the power-off control unit 7 performs switching control on the power-off switching unit 4 based on at least one of operation frequencies of a plurality of circuit blocks in a corresponding memory bank, circuit volumes of the plurality of circuit blocks, standby power of the plurality of circuit blocks, and a circuit volume of the power-off switching unit 4 for each memory bank. In further detail, the power-off control unit 7 generates the power-off switching information of the power-off switching unit 4 and causes the information to be held in the power-off switching information holding unit 5. The power-off switching unit 4 turns on or off a plurality of power-off switches in a corresponding memory bank based on the power-off switching information.

The power management unit 8 performs power-off control for each of a plurality of memory banks into which the data cache unit 2 is divided. A detailed configuration and operation of the power management unit 8 will be described later.

The initial value register 10 stores initial parameters of power management performed by the power management unit 8. The control unit 9 sets the initial parameters stored in the initial value register 10 in the power management unit 8. The power management performed by the power management unit 8 can be arbitrarily reconfigured by arbitrarily changing the initial parameters. In other words, the power management unit 8 performs the power management according to the initial parameters.

The power management unit 8 performs, for example, power-off control of four power voltages Vread, Vwrite, Vdda, and Vddc and a ground voltage Vssc among a plurality of power voltages used by the data cache unit 2. A type of power voltage on which the power management unit 8 performs the power-off control is not limited to the four power voltages. In this specification, the power voltage and the ground voltage that are supplied or cut off by the power-off control unit 7 are also referred to collectively as a "reference voltage."

The power voltage Vread is a power voltage used for generating a bit line voltage at the time of data reading from the data cache unit 2. The power voltage Vwrite is a power voltage used for generating a bit line voltage at the time of data writing to the data cache unit 2. The power voltage Vdda is a power voltage used for setting a potential of a word line driven by an address decoder. The power voltage Vddc is a power voltage used for generating various kinds of signals used in internal circuits of the data cache unit 2 such as timing generation of the data cache unit 2, address decoding, and bit line selection.

Figure 2:
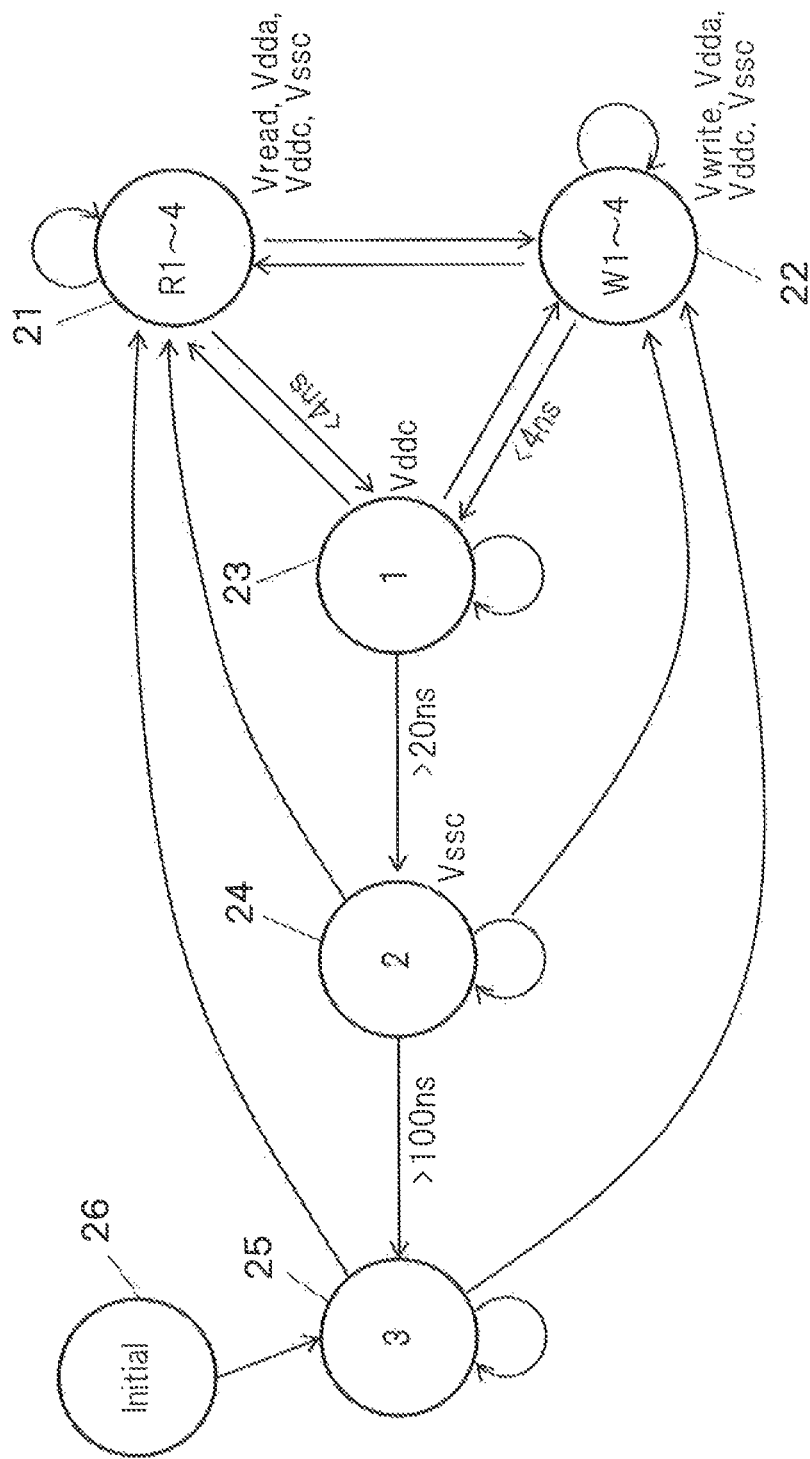
FIG. 2 is a state transition diagram in a power management unit.

The power management unit 8 includes a state machine that performs the power-off control of the four power voltages Vread, Vwrite, Vdda, and Vddc and the ground voltage Vssc, for example, according to a state transition diagram illustrated in FIG. 2.

The power management unit 8 performs the power management for each of a plurality of memory banks included in the data cache unit 2, and thus the state transition diagram of FIG. 2 corresponds to one memory bank. In other words, the power management unit 8 performs the power management based on an individual state transition diagram for each memory bank. In the present embodiment, an example in which the power management unit 8 performs the power management based on the same state transition diagram as in FIG. 2 for all the memory banks, but the power management unit 8 may perform the power management based on different state transition diagrams according to each memory bank.

The state transition diagram of FIG. 2 includes a read state (R1 to 4) 21, a write state (W1 to 4) 22, a first power-off state 23, a second power-off state 24, a third power-off state 25, and an initial state 26.

The read state 21 is a state in which data is read from one memory bank in the data cache unit 2. In the read state 21, the three power voltages Vread, Vdda, and Vddc and the ground voltage Vssc except the power voltage Vwrite among the four power voltages are supplied to a corresponding memory bank.

The write state 22 is a state in which data is written in one memory bank in the data cache unit 2. In the write state 22, the three power voltages Vwrite, Vdda, and Vddc and the ground voltage Vssc except the power voltage Vread among the four power voltages are supplied to a corresponding memory bank.

The first power-off state 23 is a state transitioned at a point in time at which the read state 21 or the write state 22 ends, and only the power voltage Vddc among the four power voltages and the ground voltage Vssc are supplied to a corresponding memory bank, and the supply of the power voltages Vread, Vwrite, and Vdda is cut off at a point in time when transition to the first power-off state 23 is performed.

The second power-off state 24 is a state transitioned when a predetermined period of time (for example, 20 ns) elapses after transition to the first power-off state 23 is performed, and in this state, the supply of all the four power voltages is cut off, and only the ground voltage Vssc is supplied to a corresponding memory bank.

The third power-off state 25 is a state transitioned when a predetermined period of time (for example, 100 ns) elapses after transition to the second power-off state 24 is performed, and in this state, the supply of all of the four power voltages and the ground voltage Vssc is cut off. The third power-off state 25 is a normal state, and when access to the data cache unit 2 is not performed, the third power-off state 25 is maintained. When the data cache unit 2 is configured with a non-volatile memory, since data can be held although no power voltage is supplied at all, in the present embodiment, the third power-off state 25 is set as the normal state.

The initial state 26 is a state immediately after the control unit 9 sets the initial parameters stored in the initial value register 10 in the power management unit 8. When the setting of the initial parameters is completed, transition from the initial state 26 to the third power-off state 25 is performed, and the third power-off state 25 is maintained until writing to or reading from the data cache unit 2 starts. When reading from the data cache unit 2 is performed, transition from the third power-off state 25 to the read state 21 is performed, and when the reading ends, return from the first power-off state 23 to the third power-off state 25 via the second power-off state 24 is performed. Further, when writing to the data cache unit 2 is performed, transition from the third power-off state 25 to the write state 22 is performed, and when the writing ends, return from the first power-off state 23 to the third power-off state 25 via the second power-off state 24 is similarly performed.

When new reading or writing starts in the first power-off state 23 or the second power-off state 24, transition to the read state 21 or the write state 22 is performed.

The power management unit 8 measures a period of time in which the first power-off state 23 is maintained and a period of time in which the second power-off state 24 is maintained using a timer. A period of time in which timer measurement is performed, that is, a period of time necessary for transition to each state is performed may be arbitrarily set and changed. A period of time in which timer measurement is performed may differ according to each memory bank.

In the present embodiment, when the supply of the power voltage is cut off, a power voltage having a small overhead is preferentially cut off. Here, it is determined whether the overhead is large or small based on at least one of operation frequencies of a plurality of circuit blocks using different types of power voltages in the data cache unit 2, circuit volumes of the plurality of circuit blocks, standby power of the plurality of circuit blocks, and a circuit volume of a power-off switch which will be described later. In other words, a circuit block having a small operation frequency is determined to be small in the overhead. A circuit block having a small circuit volume is determined to be small in the overhead. Similarly, a circuit block having high standby power is determined to be small in the overhead. Further, a power-off switch having a small circuit volume is determined to be small in the overhead.

More specifically, as a cause that the overhead of the power voltage increases, it is considered that a capacitor parasitic in a power supply path of a circuit block to which a power voltage is supplied increases, a gate capacity of a power-off switch that switches the supply and the power-off of a power voltage increases, or a delay time necessary until a power voltage reaches a desired voltage is long when the supply of the power voltage is resumed after the supply of the power voltage is temporarily cut off.

If a power voltage having a large overhead is cut off, when a power voltage is supplied after temporarily cut off, it takes a time until a power voltage reaches a desired voltage, and access to the cache memory 1 is delayed. In this regard, in the present embodiment, a power voltage having a small overhead is preferentially cut off.

The power voltages Vread and Vwrite among the four power voltages Vread, Vwrite, Vdda, and Vddc and the ground voltage Vssc are smallest in the overhead. Therefore, in the present embodiment, the supply of the power voltages Vread and Vwrite are preferentially cut off, the supply of the power voltage Vddc that is next smallest in the overhead is cut off, the supply of the power voltage Vdda that is next smallest in the overhead is cut off, and the supply of the ground voltage Vssc that is largest in the overhead is finally cut off.

A method of performing switching between the supply and the power-off of the four types of power voltages and the ground voltage Vssc in each state in the state transition diagram of FIG. 2 may be arbitrarily changed based on the initial parameters stored in the initial value register 10. Thus, the power management of the data cache unit 2 in the power management unit 8 can be reconfigured for each memory bank based on the initial parameters.

Figure 3:
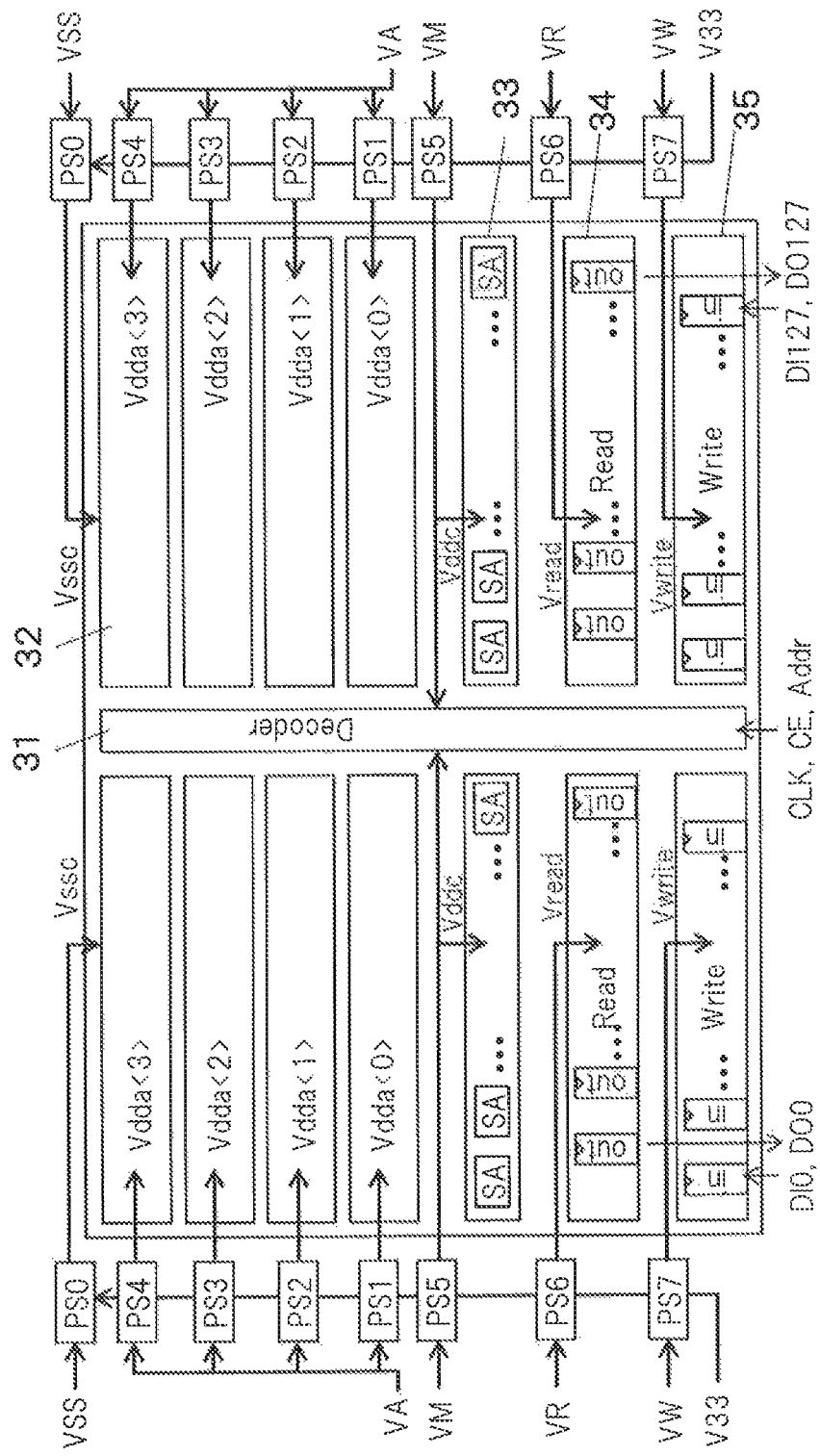
FIG. 3 is a diagram illustrating a schematic layout of a data cache unit in a cache memory of FIG. 1.

FIG. 3 is a diagram illustrating a schematic layout of the data cache unit 2 in the cache memory 1 of FIG. 1. As described above, the data cache unit 2 is divided into a plurality of memory banks, but FIG. 3 illustrates one of the memory banks. The memory bank of FIG. 3 includes a plurality of circuit blocks including an address decoder 31 arranged at substantially the center, sub array regions 32 arranged at both sides four by four, sense amplifiers 33 arranged at both sides of the address decoder 31, a read bit line driver 34, and a write bit line driver 35. Further, power-off switches PS0 to PS7 constituting the power-off switching unit 4 are arranged on left and right ends of the memory bank. An arrangement of the regions is an example and may be arbitrarily changed. The number of sub array regions 32 is not limited to that illustrated in FIG. 3.

The address decoder 31 decodes an address in accordance with an access request from a processor and drives a specific word line. The word line extends up to left and right ends of the sub array regions 32 arranged on the left and right of the address decoder 31. Since the address decoder 31 is arranged at the center of each memory bank, thus signal delay on the word lines can be uniformized.

The power-off switching unit 4 according to the present embodiment performs the power-off control of a plurality of power voltages used by each memory bank for each memory bank. A plurality of power-off switches PS0 to PS7 in the power-off switching unit 4 are divided into two and arranged on the left and right ends of the memory bank one by one as illustrated in FIG. 3. As described above, the power-off switches PS0 to PS7 are arranged at both sides of one memory bank, and thus it is possible to reduce the length of the power supply line and reduce the parasitic capacitor. Each of the power-off switches PS0 to PS7 has a transistor size according to a circuit volume of each corresponding circuit block. In further detail, a power-off switch which supplies a power voltage to a circuit block having a large circuit volume has a large transistor size.

In the example of FIG. 3, the eight power-off switches PS0 to PS7 are arranged at the left and right ends of the memory bank. The power-off switch PS0 is a switch that switches the supply and the power-off of a ground voltage VSSCC. The power-off switches PS1 to PS4 are switches that switch the supply and the power-off of the power voltage Vdda of the corresponding sub array region 32. The power-off switch PS5 is a switch that switches the supply and the power-off of the power voltage Vddc supplied to the sense amplifier 33 or the like.

The power-off switch PS6 is a switch that switches the supply and the power-off of the power voltage Vread of the read bit line driver. The power-off switch PS7 is a switch that switches the supply and the power-off of the power voltage Vwrite of the write bit line driver. As described above, practically, each of the power-off switches PS0 to PS7 has a transistor size according to a circuit volume of a corresponding circuit block.

FIG. 4 is a diagram illustrating an example of the initial parameters stored in the initial value register (initial value parameter storage unit) 10. FIG. 4 illustrates a correspondence relation among a state, a type of power voltage to be supplied, and states of the power-off switches PS0 to PS7. A position denoted as "1" indicates that a corresponding power-off switch is turned on to supply a power voltage, and a blank indicates that a corresponding power-off switch is turned off to cut off a power voltage. A comparative example of FIG. 4 is an example in which all the power-off switches PS0 to PS7 are turned on to constantly supply the power voltages.

The power management unit 8 can arbitrarily control a type of power voltage that is supplied or cut off in each state by arbitrarily changing the initial parameters illustrated in FIG. 4.

Figure 5:
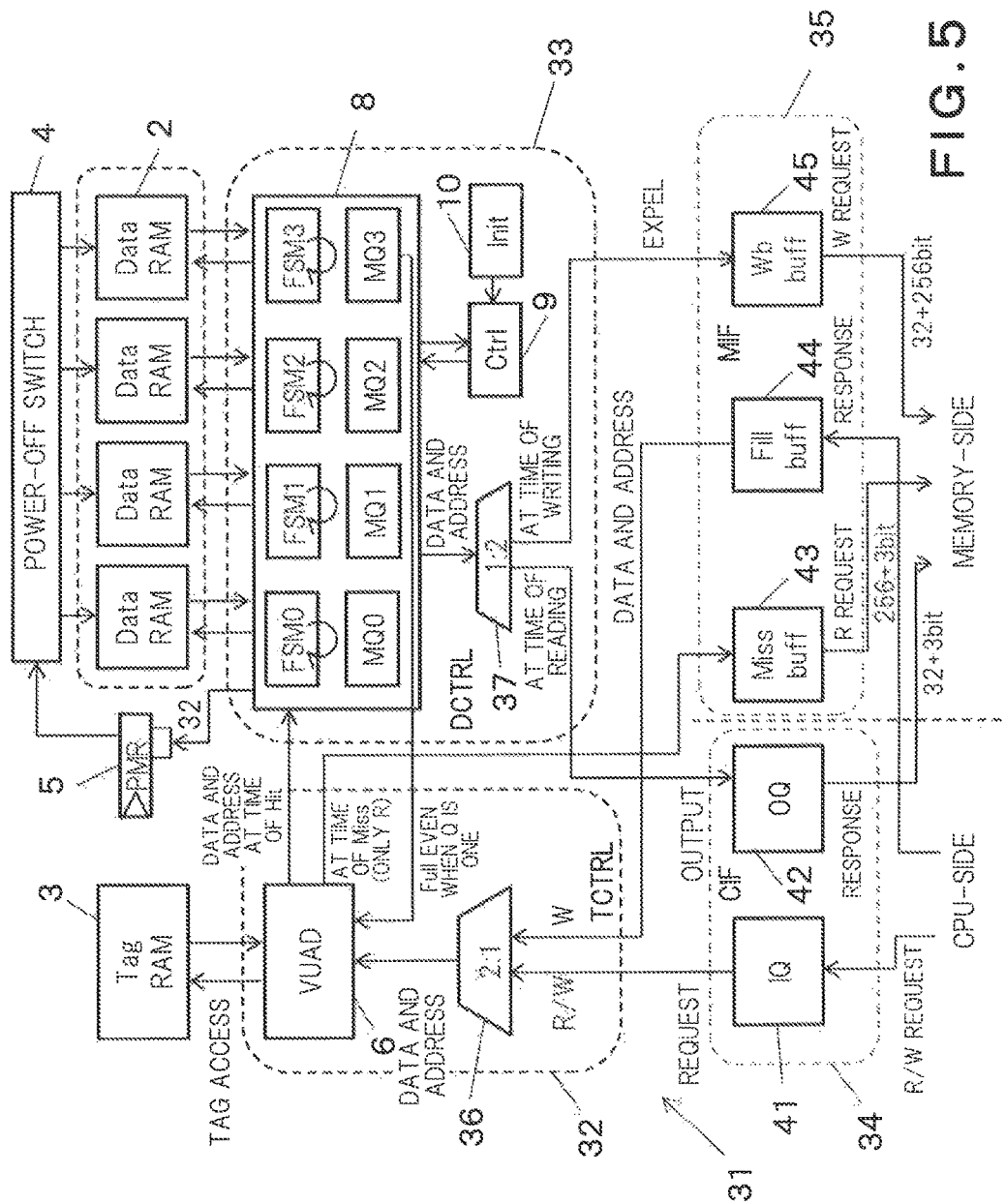
FIG. 5 is a detailed block diagram of a cache memory according to the present embodiment.

FIG. 5 is a detailed block diagram illustrating the cache memory 1 according to the present embodiment. In the cache memory 1 of FIG. 5, a detailed configuration of a cache logic unit 31 that controls the cache memory 1 is illustrated. The cache logic unit 31 includes a tag controller (TCTRL) 32, a data cache controller (DCTRL) 33, a CPU interface unit (CIF) 34, and a memory interface unit (MIF) 35.

The tag controller 32 includes the VUAD controller 6 illustrated in FIG. 1 and a 2:1 selector 36. The VUAD controller 6 performs the hit/miss determination and performs control such that the tag data is written in the tag unit 3. The 2:1 selector 36 selects either of tag data in accordance with an access request from a processor and data read from a main memory when a cache miss occurs. The 2:1 selector 36 selects the data read from the main memory when a cache miss occurs more preferentially than the tag data in accordance with an access request from a processor.

The data cache controller 33 includes a 1:2 selector 37 in addition to the power-off control unit 7 illustrated in FIG. 1.

The power management unit (initial value parameter setting unit) 8 in the power-off control unit 7 includes a plurality of power-off order control units FSM0 to FSM3 and a plurality of memory queues (storage units) MQ0 to MQ3 installed in association with the power-off order control units.

The power-off order control units FSM0 to FSM3 control a power-off order of a plurality of power voltages using a predetermined state machine in which state transition is set based on the initial parameters. Each of the power-off order control units FSM0 to FSM3 and each of the memory queues MQ0 to MQ3 are set for each memory bank. Each of a plurality of power-off order control units FSM0 to FSM3 performs the power-off control of a corresponding memory bank. Each of a plurality of memory queues MQ0 to MQ3 hold data in order while a corresponding memory bank is powered off. Each of the memory queues MQ0 to MQ3 has a predetermined number of entries, and when data is input to all the entries, the VUAD controller 6 instruct the CPU interface unit 34 to stop loading data.

When the supply of the power voltage to the memory bank starts, data held in the corresponding memory queues MQ0 to MQ3 is sequentially transmitted to the memory bank, and it is possible to access the memory bank without any problem even when the memory bank is temporarily powered off.

The 1:2 selector 37 in the data cache controller 33 transmits data and an address read from the data cache unit 2 to the CPU interface unit 34 at the time of reading, and when cache data is expelled, if the data is dirty, the 1:2 selector 37 transmits the data to the memory interface unit 35 so that the data read from the data cache unit 2 is written in the main memory.

The CPU interface unit 34 includes an IQ buffer 41 and an OQ buffer 42. The IQ buffer 41 buffers a read/write request from a processor and an address and data at the time of writing and transmits them to the tag controller 32. The OQ buffer 42 buffers and outputs the data and the address read from the data cache unit 2 at the time of reading.

The memory interface unit 35 includes a miss buffer 43, a fill buffer 44, and a Wb buffer 45. The miss buffer 43 buffers and outputs data and an address in which a cache miss has occurred. The fill buffer 44 buffers data and an address read from the main memory when a cache miss occurs, and transmits the data and the address to the tag controller 32. When cache data is expelled, if the data is dirty, the Wb buffer 45 buffers and outputs the expelled data and an address.

Figure 6:
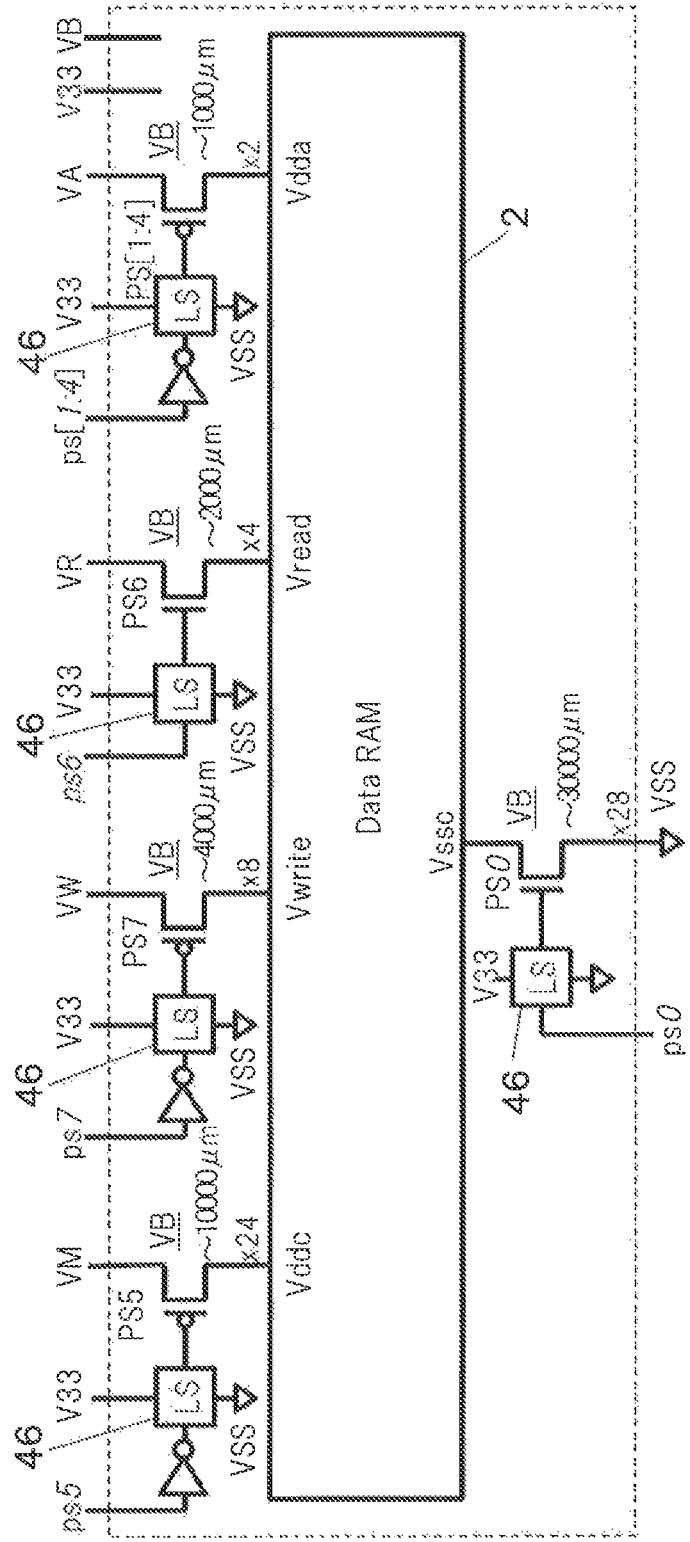
FIG. 6 is a circuit diagram illustrating a detailed configuration of a power-off switching unit.

FIG. 6 is a circuit diagram illustrating a detailed configuration of the power-off switching unit 4. Power voltages VM, VW, VR, and VA are original voltages for generating the power voltages Vddc, Vwrite, Vread, and Vdda and generated, for example, by a power supply circuit (not illustrated). The eight power-off switches PS0 to PS7 in the power-off switching unit 4 are controlled by control signals ps0 to ps7. The control signals ps0 to ps7 undergo voltage level conversion performed by a level shifter 46 and are input to gates of the corresponding power-off switches PS0 to PS7.

A HV transistor in which a gate oxide film is thickly formed is preferably used as the power-off switches PS0 to PS7. When the gate oxide film is thickly formed, a leak current when the power voltage is cut off can be suppressed. FIG. 6 illustrates an example in which on the basis of a gate width (for example, about 1000 μm) of the power-off switch PS[1:4], a gate width of the power-off switch PS6 is set to be about twice, a gate width of the power-off switch PS7 is set to be about 8 times, a gate width of the power-off switch PS5 is set to be about 24 times, and a gate width of the power-off switch PS0 is set to be about 28 times, but it is an example, and the present invention is not limited thereto.

The power voltages Vddc, Vdda, and Vwrite are, for example, 1.2 V, and the power voltage Vread is, for example, 0.4 V. Thus, the power-off switches PS1 to PS4, PS5, and PS7 that switch the supply and the power-off of the power voltages Vdda, Vddc, and Vwrite are configured with a PMOS transistor, and the power-off switch PS6 that switch the supply and the power-off of the power voltage Vread is configured with an NMOS transistor.

In the PMOS transistor, by setting a substrate potential Vb to 1.2 V, a leak current can be further suppressed by a reverse bias effect.

In each memory bank, one switch is not necessarily installed as each of the power-off switches PS0 to PS7. The transistor sizes of the power-off switches PS0 to PS7 differ, for example, according to the circuit volumes of the circuit blocks to which the power voltages Vddc, Vdda, and Vwrite are supplied. For example, the circuit block that is supplied with the power voltage Vddc is widely associated with the address decoder 31, the sense amplifier 33, a timing generation circuit, a bit line selection circuit, and the like. Therefore, the power-off switch PS5 that switches the supply and the power-off of the power voltage Vddc is larger in the transistor size than the other power-off switches. On the other hand, the power voltages Vread and Vwrite used in the read bit line driver and the write bit line driver are used for the purpose of driving the bit lines, the power-off switches PS6 and PS7 that switch the supply and the power-off of the power voltages Vread and Vwrite are smaller in the transistor size than the other power-off switches.

In order to suppress the leak currents when the power-off switches PS0 to PS7 perform power-off, in the present embodiment, the level shifter 46 is connected to a gate of each of the power-off switches PS0 to PS7. For example, a power voltage V33 of 3.3 V is supplied to the level shifter 46, and particularly, when the power-off switches PS1 to PS4, PS5, and PS7 configured with the PMOS transistor are turned off, the leak current can be suppressed.

Figure 7:
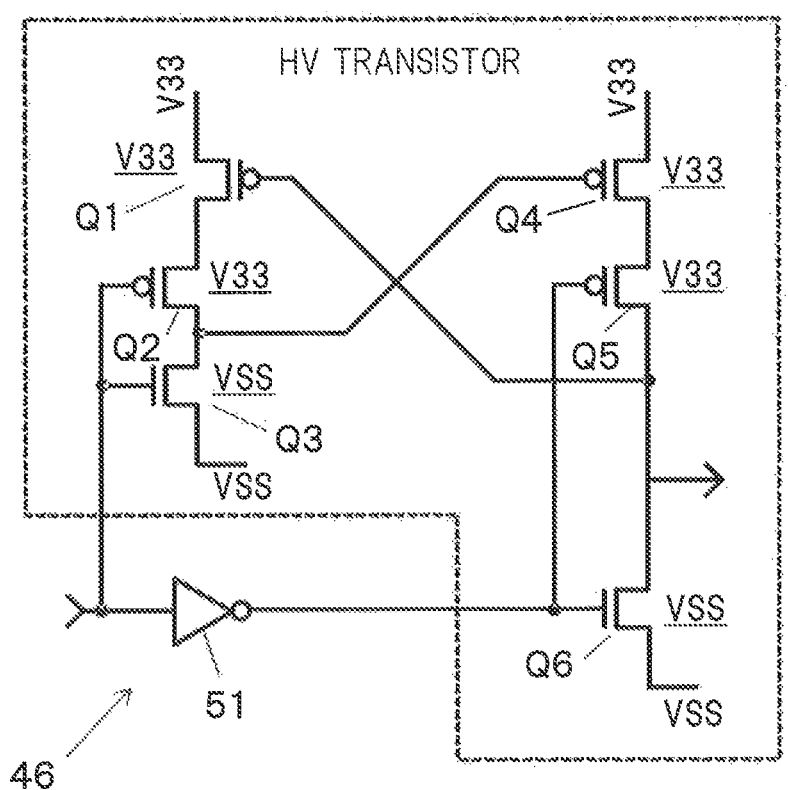
FIG. 7 is a circuit diagram illustrating an example of a level shifter.

FIG. 7 is a circuit diagram illustrating an example of the level shifter 46. The level shifter 46 of FIG. 7 includes PMOS transistors Q1 and Q2 and an NMOS transistor Q3 which are serially connected between the power voltage V33 of, for example, 3.3 V and a ground voltage VSSC, PMOS transistors Q4 and Q5 and an NMOS transistor Q6 which are serially connected between the power voltage V33 and the ground voltage VSSC, and an inverter 51. A gate of the transistor Q1 is connected to an output node Vout of the level shifter 46. Gates of the transistors Q2 and Q3 are connected to an input node Vin of the level shifter 46. A gate of the transistor Q4 is connected to connection nodes of the transistors Q2 and Q3. A signal obtained by inverting a signal input to the input node Vin through the inverter 51 is input to gates of the transistors Q5 and Q6.

The level shifter 46 of FIG. 7 can convert a signal input to the input node Vin into, for example, a signal having an amplitude of 3.3 V, and outputs the signal having an amplitude of 3.3 V. A circuit configuration of the level shifter 46 is not limited to that illustrated in FIG. 7.

Figure 8:
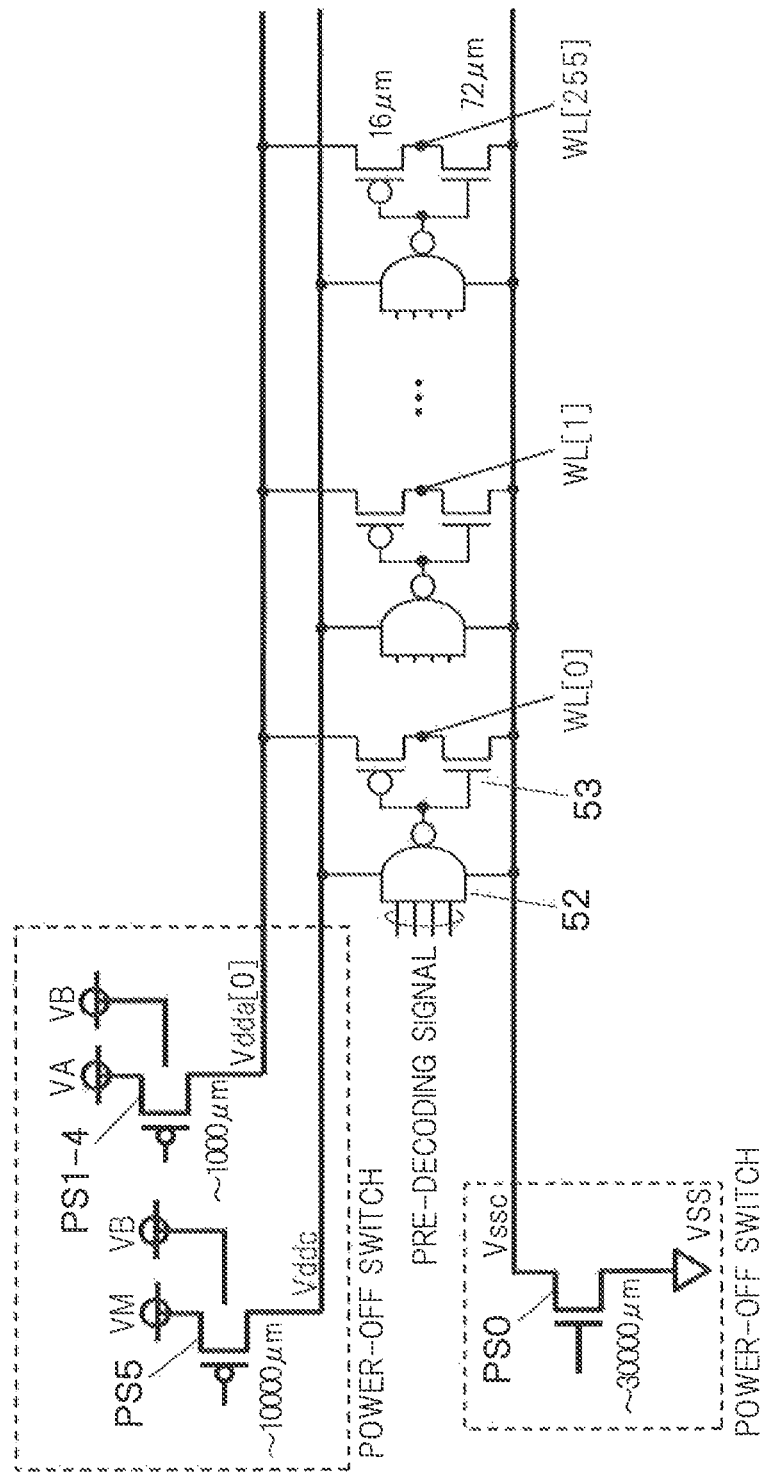
FIG. 8 is a circuit diagram illustrating an example of an internal configuration of an address decoder.

FIG. 8 is a circuit diagram illustrating an example of an internal configuration of the decoder 31 of FIG. 3, in further detail, an example of an internal configuration of the address decoder 31. The decoder 31 of FIG. 8 includes a pre-decoder 52 that generates a pre-decoding signal and an address buffer 53. The power voltage Vddc from the power-off switch PS5 and the ground voltage Vssc from the power-off switch PS0 are supplied to the pre-decoder 52. The power voltage Vdda from one of the power-off switches PS1 to PS4 and the ground voltage Vssc from the power-off switch PS0 are supplied to the address buffer 53. A word line signal is output each address buffer 53. FIG. 8 illustrates an example in which on the basis of the gate width (for example, about 1000 μm) of the power-off switch PS[1:4], the gate width of the power-off switch PS5 is set to be about 10 times, and the gate width of the power-off switch PS0 is set to be about 30 times, but it is an example, and the present invention is not limited thereto.

Since the address buffer 53 drives a word line having a length of, for example, 1 mm or more, it is necessary to increase the transistor size of the address buffer 53. For this reason, a parasitic capacitance is likely to increase, and the overhead of the address buffer 53 for the supply and the power-off of the power voltage Vdda is likely to increase. In this regard, it is desirable to install the power-off switches PS1 to PS4 that switch the supply and the power-off of the power voltage Vdda, for example, for every 256 word lines.

Since a parasitic capacitor of a signal path in the pre-decoder 52 is not so much large, it is desirable to reduce the sizes of transistors in the pre-decoder 52 to be as small as possible and further reduce the leak current. In the present embodiment, the power voltage Vddc is supplied to the pre-decoder 52 through the power-off switch PS5. Since the circuit volume of the circuit block to which the power voltage Vddc is supplied is much larger than the circuit volume of the circuit block to which the power voltage Vdda is supplied, in the present embodiment, the power voltage Vdda is more preferentially cut off than the power voltage Vddc.

Figure 9:
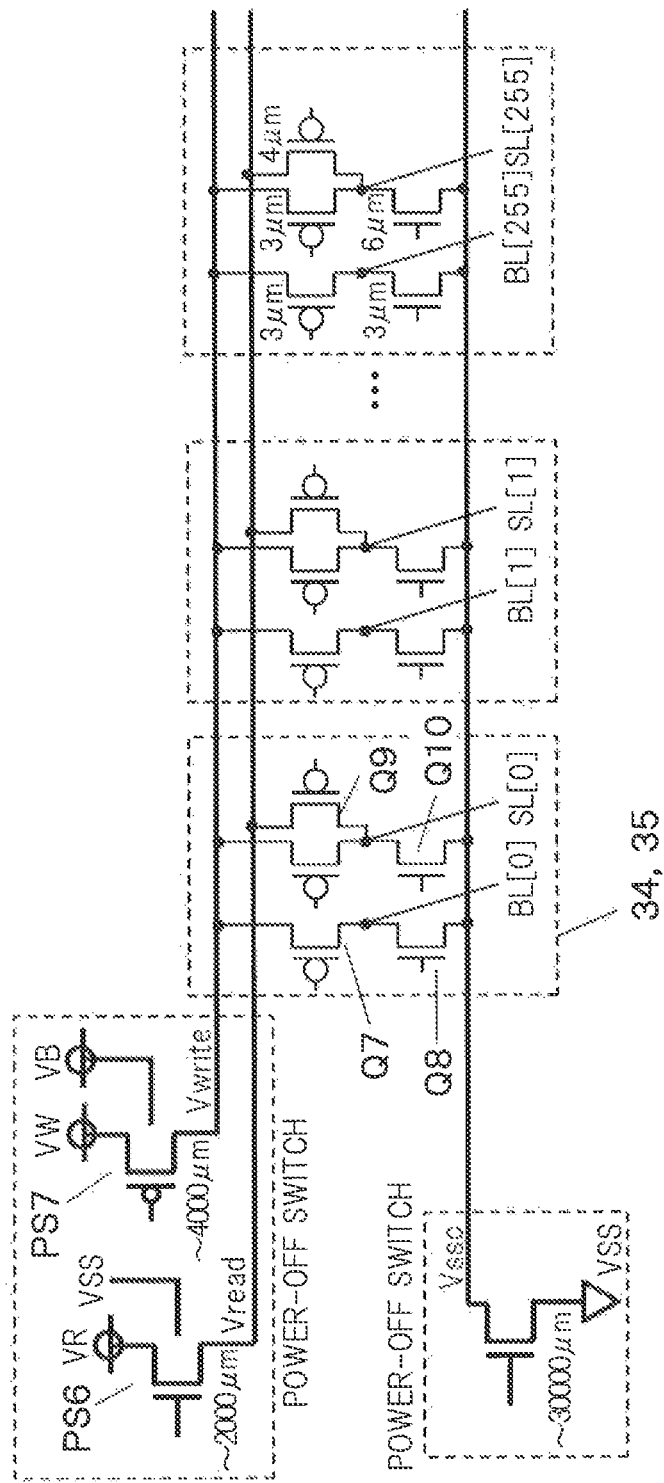
FIG. 9 is a circuit diagram of a bit line voltage control unit configured with a read bit line driver and a write bit line driver of FIG. 3.

FIG. 9 is a circuit diagram of the bit line voltage control unit 9 configured with the read bit line driver 34 and the write bit line driver 35 of FIG. 3. In FIG. 3, the read bit line driver 34 and the write bit line driver 35 are arranged in individual regions, but practically, as illustrated in FIG. 9, the read bit line driver 34 and the write bit line driver 35 are arranged to be adjacent to each other for each bit line. Bit lines BL[0] to BL[255] and SL[0] to SL[255] are paired with each other. One bit line includes a PMOS transistor Q7 and an NMOS transistor Q8 which are serially connected between the power voltage Vwrite and the ground voltage Vsscc, a PMOS transistor Q9 and an NMOS transistor Q10 which are serially connected between the power voltage Vread and the ground voltage Vsscc, and a PMOS transistor Q11 connected between the power voltage Vwrite and a drain of the NMOS transistor Q10 as illustrated in FIG. 9. The bit lines BL[0] to BL[255] are connected to connection nodes of the transistors Q7 and Q8, and the bit lines SL[0] to SL[255] are connected to connection nodes of the transistors Q9 to Q11. FIG. 9 illustrates an example in which on the basis of the gate width (for example, about 2000 μm) of the power-off switch PS6, the gate width of the power-off switch PS7 is set to be about twice, and the gate width of the power-off switch PS0 is set to be about 15 times, but it is an example, and the present invention is not limited thereto.

When reading or writing is performed on the data cache unit 2, it is necessary to drive a pair of bit lines that are equal to the number of data bits in addition to driving of one word line. Each pair of bit lines has a length of several hundred micrometers (μm) to several millimeters (mm), and the number of pairs of bit lines is large, considerable electric power is consumed for driving such bit lines.

In the case of the cache memory 1, since there is a large difference between a reading frequency and a writing frequency, and reading and writing tend to be consecutively performed, only a power voltage necessary for each operation can be supplied by separating a power voltage for reading from a power voltage for writing. In the non-volatile memory including the STT-MRAM, a read voltage and a write voltage are individually applied, and thus a read disturbance can be prevented. When the power voltage for reading is sufficiently smaller than the power voltage for writing, a power-off switch that switches the supply and the power-off of the power voltage for reading is preferably configured with an NMOS transistor.

FIG. 10 is a circuit diagram around the sense amplifier 33. A column selector 54 that selects one of a plurality of pairs of bit lines is connected to the sense amplifier 33. In order to secure sensing sensitivity, a voltage (for example, Vddc) higher than a read voltage of a bit line is applied to the sense amplifier 33. The number of sense amplifiers 33 is equal to or larger than the number of I/O bits. Since the number of sense amplifiers 33 is smaller than the number of memory cells, and the sense amplifier 33 does not dynamically consume electric power while a sensing operation is being performed, the sense amplifier 33 is connected to the power voltage Vddc. FIG. 10 illustrates an example in which on the basis of the gate width (for example, about 10000 μm) of the power-off switch PS5, the gate width of the power-off switch PS07 is set to be about three times, but it is an example, and the present invention is not limited thereto.

In the present embodiment, each of the power-off order control units in the power management unit 8 manages electric power of one memory bank as illustrated in FIG. 5. In other words, each power-off order control unit is associated with one memory bank. Thus, according to the present embodiment, since data of a plurality of ways is stored in one memory bank, when the memory bank is powered off, and then there is an access request to the memory bank, power supply to the memory bank can start before the hit/miss determination result of the tag data for the access request is obtained. Accordingly, the delay of the cache access caused by suspension of the power supply to the memory bank does not occur.

FIG. 11A is a diagram illustrating a relation between a memory bank and a way according to a related art. A structure of the tag unit 3 is illustrated on the left of FIG.

11A, and a structure of the data cache unit 2 is illustrated on the right of FIG. 11A. In the related art, as illustrated in FIG. 11C, a way is selected using upper two bits of an address, and a memory bank is selected using next two bits. For this reason, in the case of a set associative cache memory 1, in order to access data of a plurality of ways, it is necessary to access a plurality of non-volatile memories in the data cache unit 2.

On the other hand, FIG. 11B is a diagram illustrating a relation between a memory bank and a way according to the present embodiment. A structure of the tag unit 3 is illustrated on the left of FIG. 11B, and a structure of the data cache unit 2 is illustrated on the right of FIG. 11B. In the present embodiment, as illustrated in FIG. 11D, a memory bank is selected using upper two bits of an address, and a way is selected using next two bits. Thus, in the case of a set associative cache memory 1, it is possible to access a plurality of ways by accessing one non-volatile memory in the data cache unit 2.

Thus, according to the present embodiment, is possible to specify a non-volatile memory corresponding to a memory bank to be accessed with reference to an address in accordance with an access request from a processor before the hit/miss determination result by the tag access is obtained, and it is possible to start the supply of the power voltage quickly.

As described above, according to the present embodiment, the power voltages are cut off stepwise in view of the overhead when a plurality of power voltages used by the data cache unit 2 configured with the non-volatile memory are supplied or cut off, and thus the power consumption can be significantly reduced without lowering accessibility to the cache memory 1 accordingly. More specifically, since the power voltage having the small overhead is preferentially cut off, even when the power voltage already cut off is supplied again, the cache memory 1 can be used without delaying a process accordingly.

Further, since the supply and the power-off of the power voltage are controlled through the state machine, the control of the supply and the power-off of the power voltage can be arbitrarily changed by switching the initial parameters set in the state machine.

Moreover, the supply and the power-off of the power voltage can be controlled independently for each memory bank of the data cache unit 2. Thus, for example, when data of a plurality of ways that are simultaneously accessed is stored in one memory bank, although the supply of the power voltage to the memory bank is cut off, the supply of the power voltage to the memory bank is resumed before the hit/miss determination result by the tag access is obtained, and thus the cache access speed is prevented from being lowered.

Further, some among a plurality of power-off switches that supply or cut off the power voltage are configured with a PMOS transistor whose substrate voltage is set to a predetermined voltage, and thus when the power-off switch is turned off, the leak current can be suppressed by the reverse bias effect.

The above-described embodiment has been described in connection with the example in which the present embodiment is applied to the cache memory 1, but the present embodiment can be applied for a purpose other than the cache memory 1. For example, the present embodiment can be applied to a main memory, a work memory, or the like using a non-volatile memory. A type of non-volatile memory is not limited to STT-MRAM, and various non-volatile memories can be applied.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory system, comprising:
a non-volatile memory including a plurality of circuit blocks using different voltages;
a power-off switch circuitry that switches whether or not voltage supply to each of the plurality of circuit blocks in the non-volatile memory is cut off; and
a power-off controller that controls the switching of the power-off switch circuitry based on operation frequencies of the plurality of circuit blocks and at least one of circuit volumes of the plurality of circuit blocks, standby power of the plurality of circuit blocks, or a circuit volume of the power-off switch circuitry,
wherein the non-volatile memory comprises a plurality of memory banks each of which comprises the plurality of circuit blocks,
the power-off switch circuitry switches whether or not the voltage supply to the plurality of circuit blocks in the memory bank is cut off for the memory bank, and
the power-off controller comprises a storage that holds access information for a memory bank in which the voltage supply is cut off.

2. The memory system according to claim 1,
wherein the power-off switch circuitry comprises a plurality of power-off switches of sizes depending on the circuit volumes of the circuit blocks for each memory bank.

3. The memory system according to claim 2,
wherein at least one of the plurality of power-off switches is a PMOS transistor whose substrate voltage is set to a predetermined voltage.

4. The memory system according to claim 1,
wherein the power-off controller cuts off voltage supply to a first circuit block having a first operation frequency before cutting off supply of a voltage to a second circuit block, the second circuit block having a second operation frequency higher than the first operation frequency.

5. The memory system according to claim 1,
wherein the non-volatile memory includes a magnetoresistive RAM (MRAM).

6. A memory system, comprising:
a non-volatile memory including a plurality of circuit blocks using different voltages;
a power-off switch circuitry that switches whether or not voltage supply to each of the plurality of circuit blocks in the non-volatile memory is cut off; and
a power-off controller that controls the switching of the power-off switch circuitry based on at least one of circuit volumes of the plurality of circuit blocks, standby power of the plurality of circuit blocks, and a circuit volume of the power-off switch circuitry,
wherein the power-off controller comprises:
a power-off order controller that controls a power-off order of the plurality of voltages using a predetermined state machine in which state transition is set based on parameters, a parameters storage that stores the parameters, and
a parameters setting circuitry that sets the parameters in the power-off order controller.

7. A memory system, comprising:
a non-volatile memory including a plurality of circuit blocks using different voltages;
a power-off switch circuitry that switches whether or not voltage supply to each of the plurality of circuit blocks in the non-volatile memory is cut off; and
a power-off controller that controls the switching of the power-off switch circuitry based on at least one of circuit volumes of the plurality of circuit blocks, standby power of the plurality of circuit blocks, and a circuit volume of the power-off switch circuitry,
wherein the power-off controller cuts off supply of a voltage to a first circuit block having a first circuit volume before cutting off supply of a voltage to a second circuit block, the second circuit block having a second circuit volume larger than the first circuit volume.

8. A memory system, comprising:
a non-volatile memory including a plurality of circuit blocks using different voltages;
a power-off switch circuitry that switches whether or not voltage supply to each of the plurality of circuit blocks in the non-volatile memory is cut off; and
a power-off controller that controls the switching of the power-off switch circuitry based on at least one of circuit volumes of the plurality of circuit blocks, standby power of the plurality of circuit blocks, and a circuit volume of the power-off switch circuitry,
wherein the power-off controller cuts off voltage supply to a common ground of the plurality of circuit blocks, in a last order among the different voltages.

9. A cache memory, comprising:
a data cache that stores data and comprises a non-volatile memory comprising a plurality of circuit blocks using different voltages;
a tag that stores address information of the data stored in the data cache;
a power-off switch circuitry that switches whether or not voltage supply to each of the plurality of circuit blocks in the non-volatile memory is cut off; and
a power-off controller that controls the switching of the power-off switch circuitry based on at least one of circuit volumes of the plurality of circuit blocks, standby power of the plurality of circuit blocks, and a circuit volume of the power-off switch circuitry,
wherein the power-off controller cuts off supply of a voltage to a first circuit block having a first circuit volume before cutting off supply of a voltage to a second circuit block, the second circuit block having a second circuit volume larger than the first circuit volume.

10. A cache memory, comprising:
a data cache that stores data and comprises a non-volatile memory comprising a plurality of circuit blocks using different voltages;
a tag that stores address information of the data stored in the data cache;
a power-off switch circuitry that switches whether or not voltage supply to each of the plurality of circuit blocks in the non-volatile memory is cut off; and
a power-off controller that controls the switching of the power-off switch circuitry based on at least one of circuit volumes of the plurality of circuit blocks, standby power of the plurality of circuit blocks, and a circuit volume of the power-off switch circuitry,
wherein the power-off controller cuts off voltage supply to a common ground of the plurality of circuit blocks, in a last order among the different voltages.

11. A cache memory, comprising:
a data cache that stores data and comprises a non-volatile memory comprising a plurality of circuit blocks using different voltages;
a tag that stores address information of the data stored in the data cache;
a power-off switch circuitry that switches whether or not voltage supply to each of the plurality of circuit blocks in the non-volatile memory is cut off; and
a power-off controller that controls the switching of the power-off switch circuitry based on operation frequencies of the plurality of circuit blocks and at least one of circuit volumes of the plurality of circuit blocks, standby power of the plurality of circuit blocks, or a circuit volume of the power-off switch circuitry,
wherein the non-volatile memory comprises a plurality of memory banks each of which comprises the plurality of circuit blocks,
the power-off switch circuitry switches whether or not the voltage supply to the plurality of circuit blocks in the memory bank is cut off for the memory bank, and
the power-off controller comprises a storage that holds access information for a memory bank in which the voltage supply is cut off.

12. The cache memory according to claim 11,
wherein the memory bank stores data of a plurality of ways that are accessed in parallel.

13. The cache memory according to claim 11,
wherein the power-off switch circuitry comprises a plurality of power-off switches of sizes depending on the circuit volumes of the circuit blocks for each memory bank.

14. The cache memory according to claim 13,
wherein at least one of the plurality of power-off switches is a PMOS transistor whose substrate voltage is set to a predetermined voltage.

15. The cache memory according to claim 11,
wherein the power-off controller comprises:
a power-off order controller that controls a power-off order of the plurality of voltages using a predetermined state machine in which state transition is set based on parameters,
a parameters storage that stores the parameters, and
parameters setting circuitry that sets the parameters in the power-off order controller.

16. The cache memory according to claim 11,
wherein the non-volatile memory includes a magnetoresistive RAM (MRAM).

* * * * *